(12) United States Patent
Yu et al.

(10) Patent No.: US 7,199,626 B2
(45) Date of Patent: *Apr. 3, 2007

(54) DELAY-LOCKED LOOP DEVICE CAPABLE OF ANTI-FALSE-LOCKING AND RELATED METHODS

(75) Inventors: Ming-Shih Yu, Taipei Hsien (TW); Song-Rong Han, Taipei Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 35 days.

This patent is subject to a terminal disclaimer.

(21) Appl. No.: 11/160,292

(22) Filed: Jun. 17, 2005

(65) Prior Publication Data

US 2006/0284656 A1 Dec. 21, 2006

(51) Int. Cl.
*H03L 7/06* (2006.01)

(52) U.S. Cl. .................................. 327/156; 327/161
(58) Field of Classification Search ............... None
See application file for complete search history.

(56) References Cited

U.S. PATENT DOCUMENTS

| | | | |
|---|---|---|---|
| 6,452,431 B1 * | 9/2002 | Waldrop | ............... 327/158 |
| 6,625,242 B1 | 9/2003 | Yoo et al. | |
| 6,844,761 B2 * | 1/2005 | Byun et al. | ............... 327/149 |
| 7,015,725 B1 * | 3/2006 | Yu et al. | ............... 327/12 |
| 2005/0073343 A1 * | 4/2005 | Kim et al. | ............... 327/156 |

FOREIGN PATENT DOCUMENTS

TW 522651 3/2003

* cited by examiner

*Primary Examiner*—Timothy P. Callahan
*Assistant Examiner*—Cassandra Cox
(74) *Attorney, Agent, or Firm*—Winston Hsu

(57) ABSTRACT

The present invention discloses a delay-locked loop device capable of anti-false-locking, which comprises: a voltage control delay circuit comprising a plurality of delay units in a series for generating a delayed phase according to a reference phase and a control voltage; a phase detector coupled to the voltage control delay circuit for generating a control signal according to a lock indication signal, the reference phase, and the delayed phase; a charge pump coupled to the phase detector for transmitting the control voltage to the voltage control delay circuit according to the control signal; and a lock detector coupled to the voltage control delay circuit for generating the lock indication signal for the phase detector according to output phases of at least one delay unit of the voltage control delay circuit.

9 Claims, 11 Drawing Sheets

DELAY-LOCKED LOOP DEVICE CAPABLE OF ANTI-FALSE-LOCKING AND RELATED METHODS

BACKGROUND OF THE INVENTION

1. Field of the Invention

The present invention provides a delay-locked loop device capable of anti-false-locking and related methods, and more particularly, a delay-locked loop device capable of decreasing the number of shift registers needed.

2. Description of the Prior Art

Digital integrated circuits have been highly developed. Personal computers, mobile phones, digital watches, and calculators, for example, are applications of digital integrated circuits. With high-speed, microminiaturized, and multi-function developments, a complex digital integrated circuit often includes a plurality of units. The units delay a reference timer with different degrees, so a delay-locked loop (DLL) device is need for maintaining synchronization of the digital integrated circuit. In order to improve effects of stuck lock, harmonic lock, small lock range and asymmetric duty cycle, the prior art provides a delay-locked loop device capable of anti-false-locking. Please refer to FIG. 1, which illustrates a schematic diagram of a prior art DLL device 100 capable of anti-false-locking. The DLL device 100 includes a phase detector 102, a charge pump 104, a loop filter 10, a voltage control delay circuit 108, a reference-phase generator 110, and a lock detector 116. The voltage control delay circuit 108 includes a plurality of delay units 112 for outputting a delayed phase Fde from the last delay unit 112 to the phase detector 102. The DLL device 100 forms a lock loop 114 according to a lock indication signal SpI provided by the lock detector 116, including an under signal Su, a right signal Sr, and an over signal So.

As to a configuration of the lock detector 116 in FIG. 1, please refer to FIG. 2. In FIG. 2, the lock detector 116 includes a frequency divider 118, a first shift register set 120, a second shift register set 122, and a logic module 124. The first shift register set 120 includes N units of D flip-flops 126, while the second shift register set 122 includes M units of D flip-flops 128. The frequency divider 118 outputs a first divided phase Fref_2 and a second divided phase Fref_2B according to rising edges of a reference phase Fref provided by the reference-phase generator 110. Frequencies of the first and second divided phases Fref_2 and Fref_2B are half the frequency of the reference phase Fref, and the second divided phase Fref_2B is the inverse of the first divided phase Fref_2. The DLL device 100 is free from the problem of duty-cycle asymmetry by using the frequency divider 118. In FIG. 2, the first shift register set 120 outputs the comparison signal $QC_1 \sim QC_{N+1}$ to the second shift register set 122 according to the first divided phase Fref_2 and the signals CK1~CK(N+1) outputted from the delay units 112 of the voltage control delay circuit 108. Each D flip-flop 128 of the second shift register set 122 corresponds to each D flip-flop 126 of the first shift register set 120 for sampling the comparison signals $QC_1 \sim QC_{N+1}$ with the second divided phase Fref_2B, and outputting a sequence of comparison signals L1~L(M+1) to the logic module 124. Then, the logic module 124 can output the lock indication signal SpI according to the comparison signals L1~L(M+1).

Therefore, the DLL device 100 can prevent occurrences of false lock, stuck lock, harmonic lock, a small lock range and an asymmetric duty cycle. And, by increasing the D flip-flops 126, 128 in the first shift register set 120 and the second shift register set 122, the DLL device 100 can further increase the lock range and accuracy. However, the more D flip-flops 126 and 128 there are, the larger the DLL device 100 becomes, and the higher the production cost will be. Moreover, the DLL device 100 may cause a false lock because of inverse phases of output signals of the delay unit 112.

For example, please refer to FIG. 3, which illustrates a schematic diagram of a voltage control delay circuit having five stages of delay units 302 in a prior art DLL device. In FIG. 3, signals CK1~CK5 respectively represent phases outputted from each delay unit 302, and signals CK1B~CK5B represent inverse phases of the signals CK1~CK5. Ideally, a reference phase Fref is delayed by each delay unit 302, and becomes the signals CK1~CK5 outputting to a first shift register set. Also, an inverse phase FrefB of the reference phase Fref is delayed by each delay unit 302, and becomes the signals CK1B, CK2B, CK3B, CK4B, and CK5B. Please refer to FIG. 4 and FIG. 5. FIG. 4 illustrates a schematic diagram of signals of a false lock, and FIG. 5 illustrates a schematic diagram of phases corresponding to the signals in FIG. 4. Suppose that a required delay amount is one cycle, which means that an expected phase difference, between the signal CK5 outputted from the last delay unit 302 and the reference phase Fref, is 360°. However, comparing the phases, the phase difference between the reference phase Fref and the phase FrefB is 180°, so that if a phase difference between the signal CK5 and the reference phase Fref is 180°, then a phase difference between the inverse signal CK5B and the reference phase Fref is just 360°. Therefore, in FIG. 5, the first shift register set will output the comparison signals $QC_1-QC_5$ according to the signals CK2, CK4, CK1B, CK3B, and CK5B. In this situation, the phase difference between the locked phase and the reference phase Fref is only 180°, and a false lock occurs.

Therefore, the prior art DLL device suffers a false lock owing to inverse phases of signals outputted from the delay units of the voltage control delay circuit.

SUMMARY OF THE INVENTION

It is therefore a primary objective of the claimed invention to provide a delay-locked loop device capable of anti-false-locking and related methods.

The present invention discloses a method for simplifying a delay-locked loop device. First of all, phases outputted from delay units of a voltage control delay circuit in the delay-locked loop device are reversed. Then, the reversed phases are transmitted to shift registers in a first shift register set corresponding to the delay units of the voltage control delay circuit, so as to generate a first sequence of comparison signals according to a first divided phase and inverse phases of phases outputted from the delay units of the voltage control delay circuit. Next, a plurality of shift registers in the first shift register set corresponding to a plurality of delay units of initial stages of the voltage control delay circuit are removed according to a default requirement. Finally, shift registers in a second shift register set corresponding to the removed shift registers in the first shift register set are removed, so as to generate a second sequence of comparison signals according to a second divided phase and the first sequence of the comparison signals.

The present invention further discloses a method for performing a delay lock. The method includes following steps. First, the method generates a delayed phase with a voltage control delay circuit according to a reference phase and a control voltage. Second, the method generates a control signal according to a lock indication signal, the reference phase, and the delayed phase with a phase detector. Third, the method transmits the control voltage to the voltage control delay circuit according to the control signal with a charge pump. Fourth, the method generates the lock indication signal for the phase detector according to output phases of at least one delay unit of the voltage control delay circuit with a lock detector. Fifth, the method generates a first sequence of comparison signals according to a first divided phase and the output phases of at least one delay unit of the voltage control delay circuit with a first shift register set. Sixth, the method generates a second sequence of comparison signals according to a second divided phase and the first sequence of the comparison signals with a second shift register set. Finally, the method generates the lock indication signal according to the second sequence of the comparison signals with a logic module.

The present invention further discloses a delay-locked loop device capable of anti-false-locking. The delay-locked loop device comprises: a voltage control delay circuit comprising a plurality of delay units in a series for generating a delayed phase according to a reference phase and a control voltage; a phase detector coupled to the voltage control delay circuit for generating a control signal according to a lock indication signal, the reference phase, and the delayed phase; a charge pump coupled to the phase detector for transmitting the control voltage to the voltage control delay circuit according to the control signal; and a lock detector coupled to the voltage control delay circuit for generating the lock indication signal for the phase detector according to output phases of at least one delay unit of the voltage control delay circuit. The lock detector comprises: a first shift register set comprising a number, smaller than the number of the delay units in the voltage control delay circuit, of shift registers each corresponding to a delay unit of the voltage control delay circuit for generating a first sequence of comparison signals according to a first divided phase and the output phases of each delay unit of the voltage control delay circuit; a second shift register set comprising a plurality of shift registers each corresponding to a shift register of the first shift register set for generating a second sequence of comparison signals according to a second divided phase and the first sequence of the comparison signals; and a logic module coupled to the second shift register set for generating the lock indication signal according to the second sequence of the comparison signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
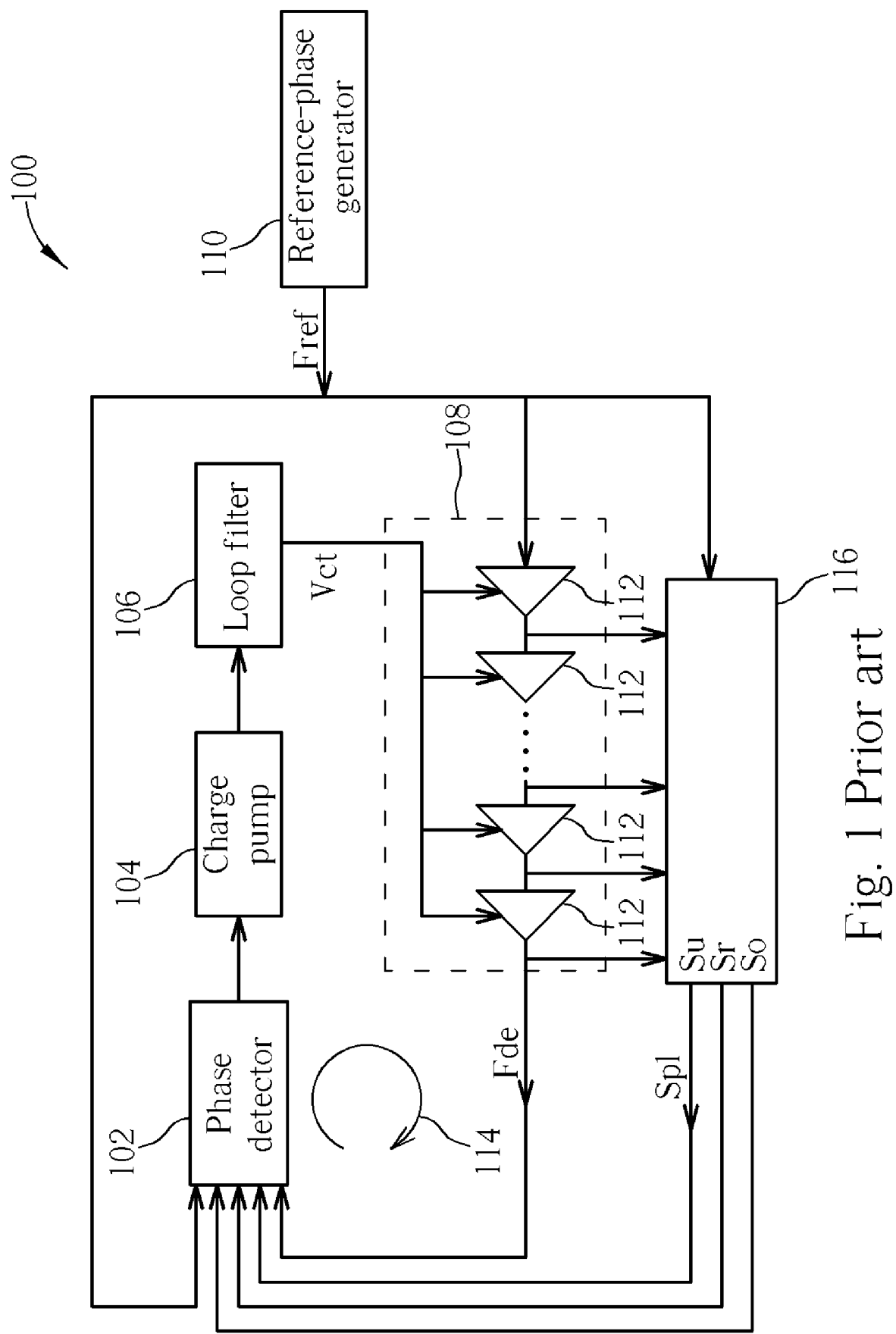
FIG. 1 illustrates a schematic diagram of a prior art DLL device capable of anti-false-locking.
Figure 6:
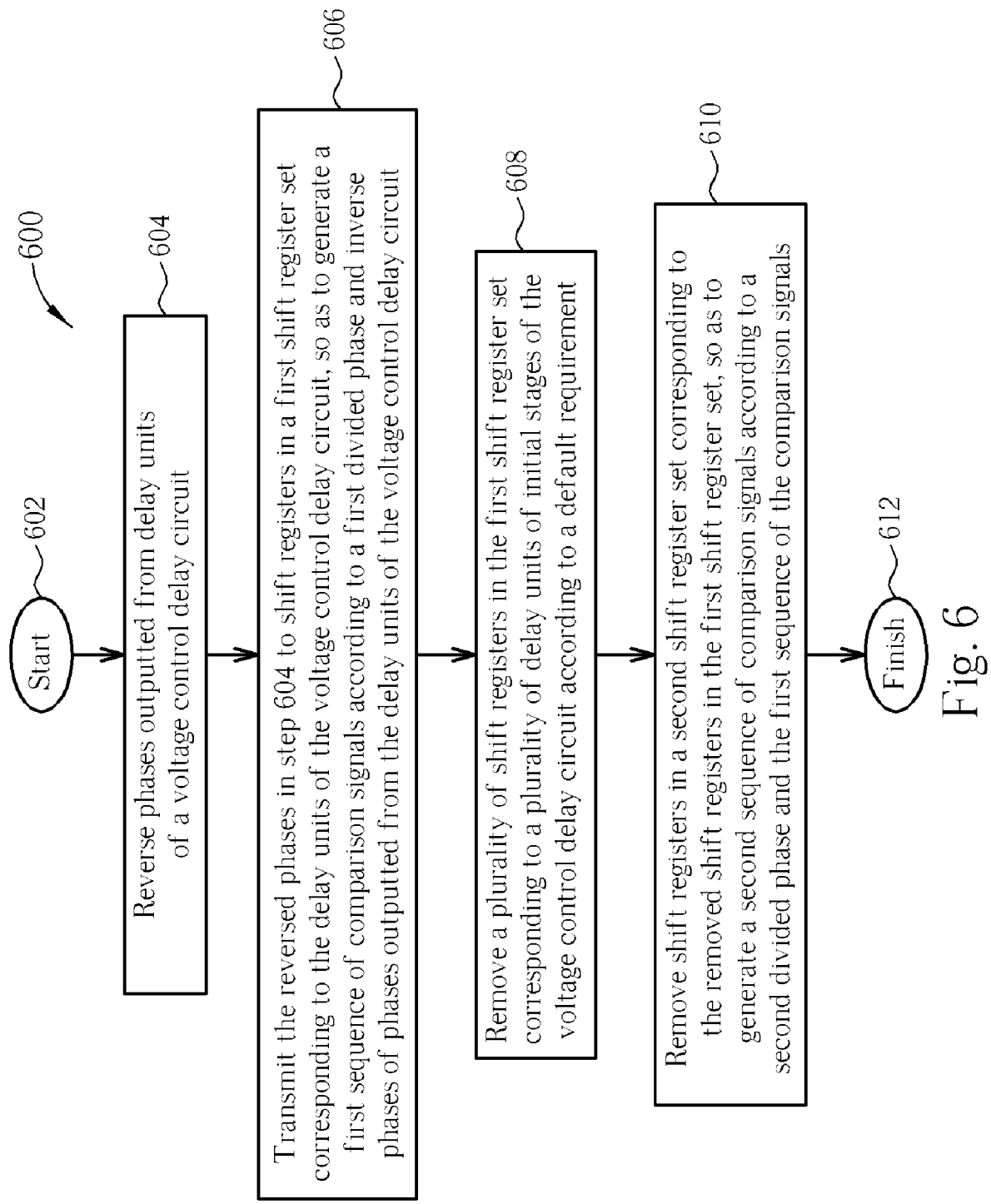
FIG. 6 illustrates a flowchart of a process for simplifying a DLL device in accordance with the present invention.

Please refer to FIG. 6, which illustrates a flowchart of a process 600 for simplifying a DLL device in accordance with the present invention. The process 600 is utilized for simplifying DLL devices such as the DLL device 100 shown in FIG. 1, and includes the following steps:

Step 602: start.

Step 604: reverse phases outputted from delay units of a voltage control delay circuit.

Step 606: transmit the reversed phases in step 604 to shift registers in a first shift register set corresponding to the delay units of the voltage control delay circuit, so as to generate a first sequence of comparison signals according to a first divided phase and inverse phases of phases outputted from the delay units of the voltage control delay circuit;

Step 608: remove a plurality of shift registers in the first shift register set corresponding to a plurality of delay units of initial stages of the voltage control delay circuit according to a default requirement;

Step 610: remove shift registers in a second shift register set corresponding to the removed shift registers in the first shift register set, so as to generate a second sequence of comparison signals according to a second divided phase and the first sequence of the comparison signals.

Step 612: finish.

Figure 2:
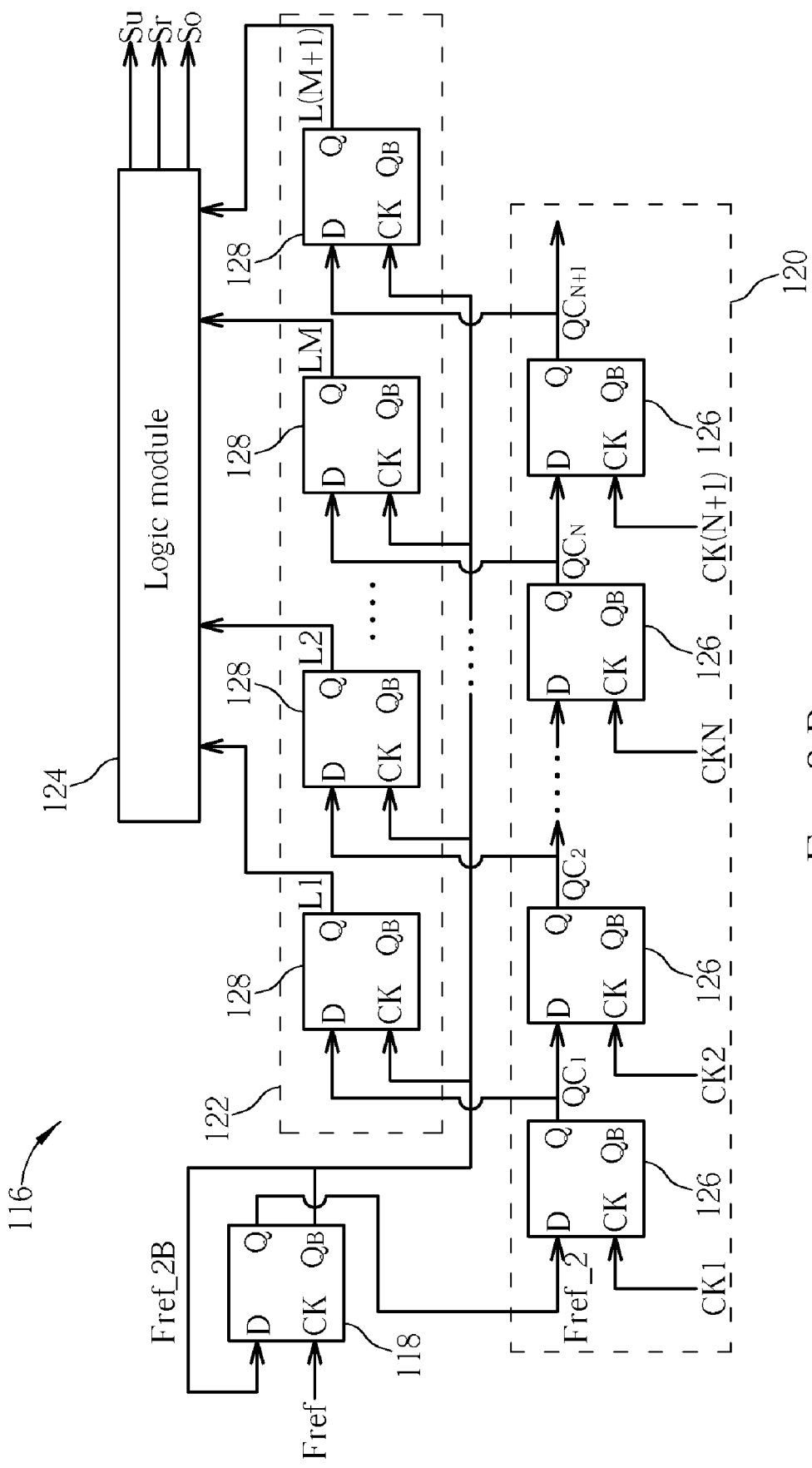
FIG. 2 illustrates a schematic diagram of a configuration of the lock detector shown in FIG. 1.
Figure 3:
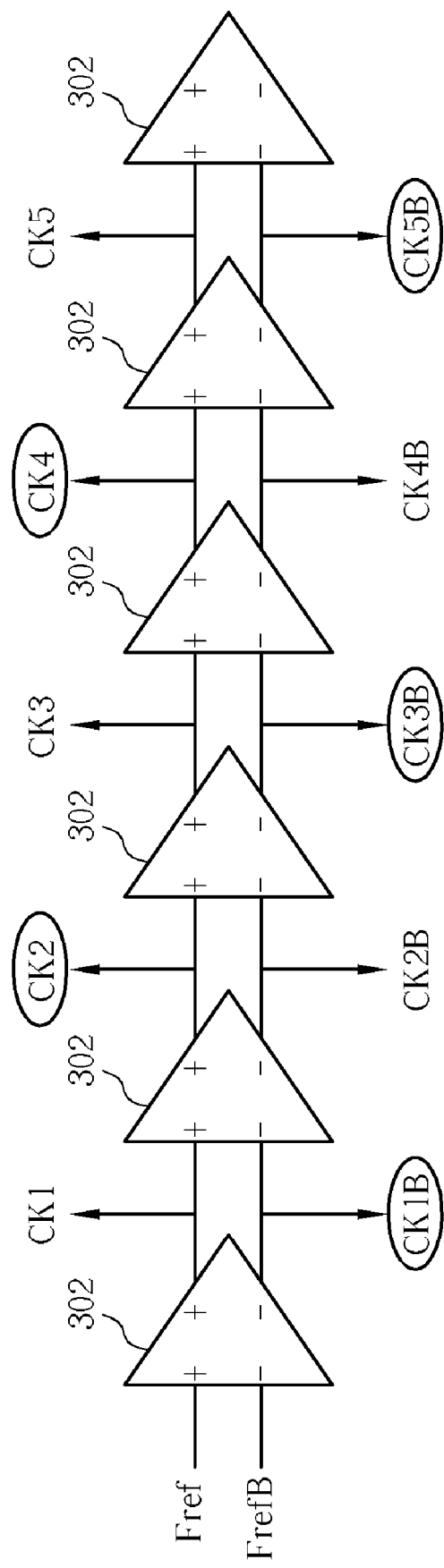
FIG. 3 illustrates a schematic diagram of a voltage control delay circuit having five stages of delay units in a prior art DLL device.
Figure 4:
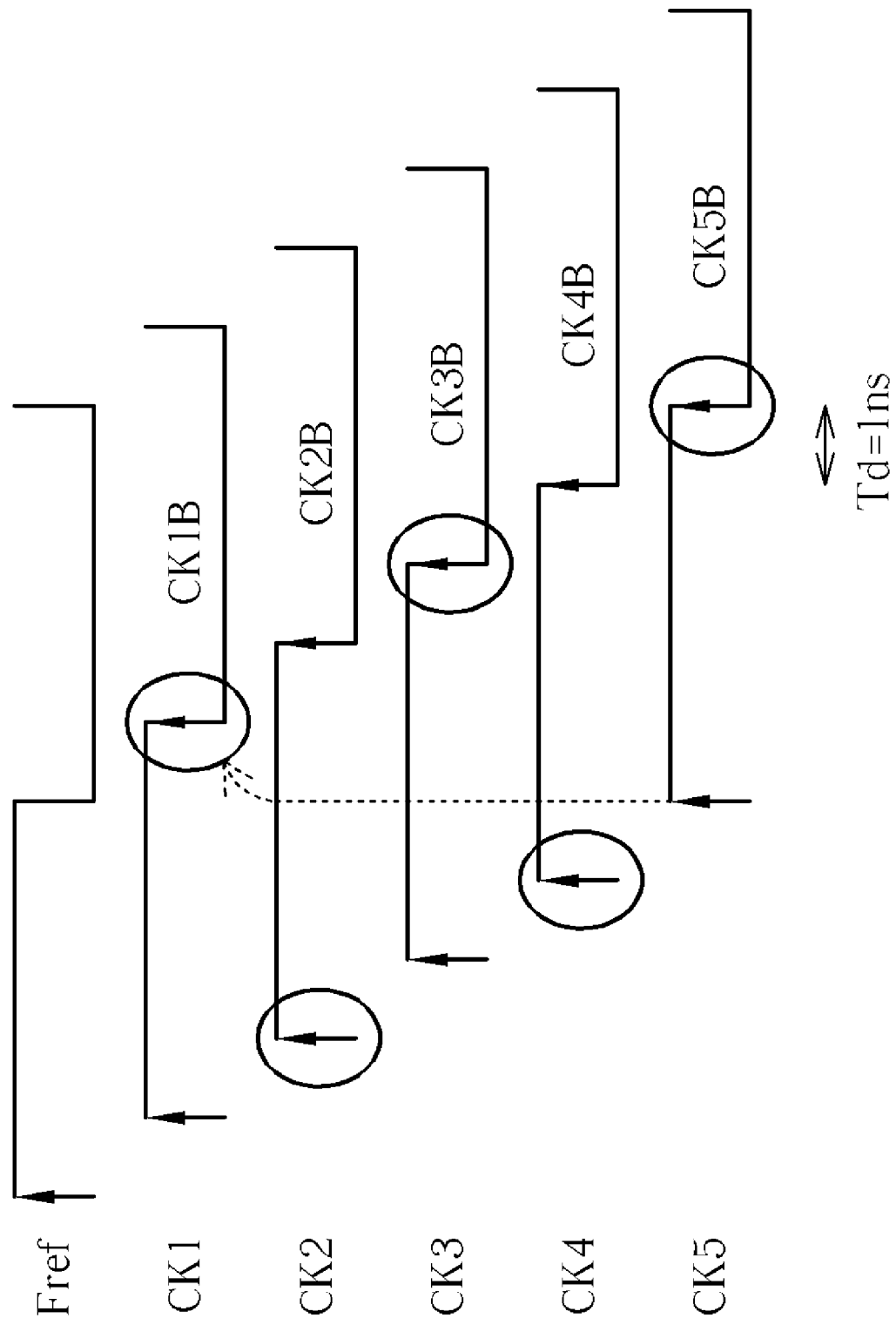
FIG. 4 illustrates a schematic diagram of signals of a false lock.
Figure 5:
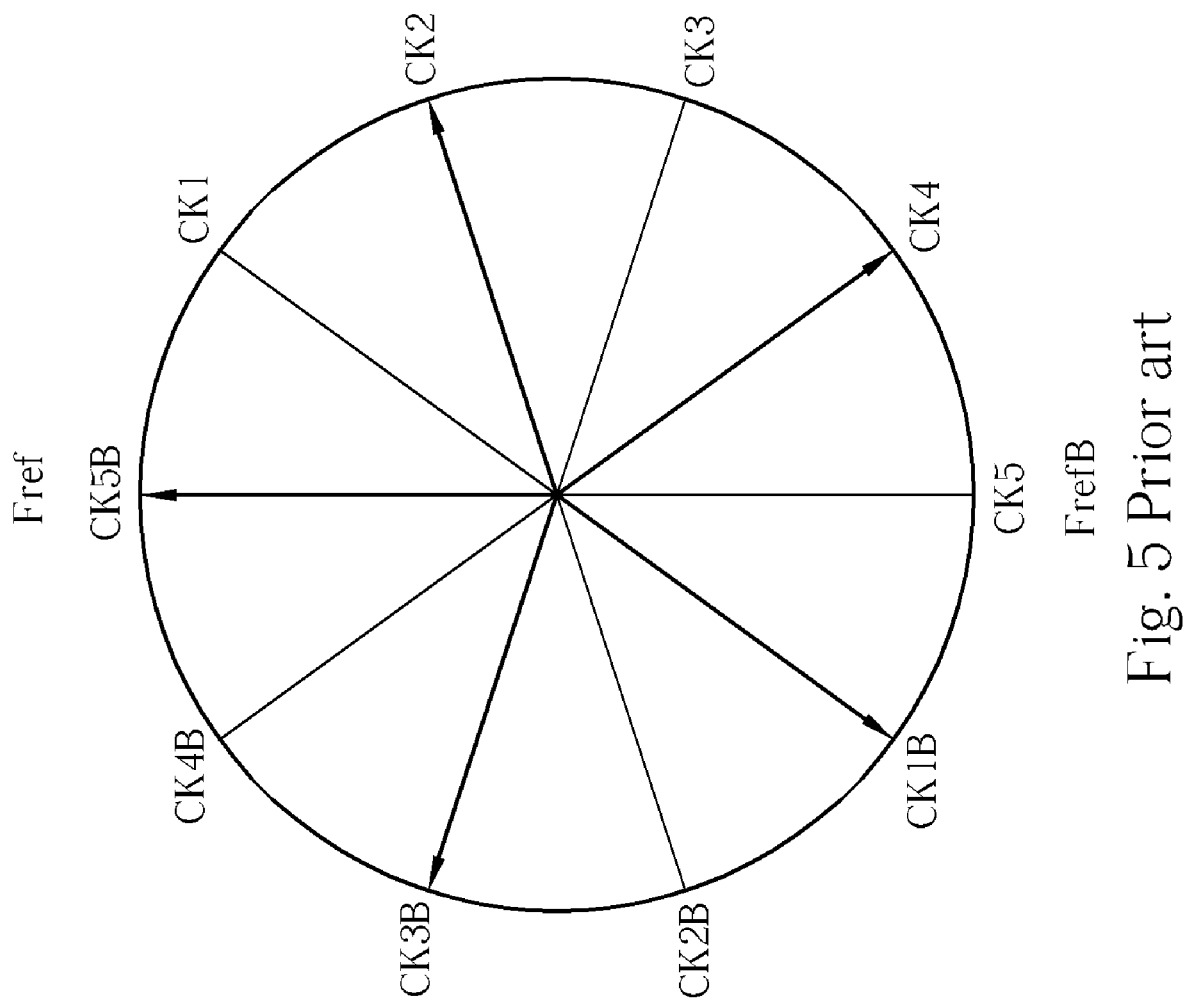
FIG. 5 illustrates a schematic diagram of phases corresponding to the signals in FIG. 4.

Therefore, according to the "inverse" signals outputted from the delay units of the voltage control delay circuit, the present invention can decrease the number of needed shift registers. Please refer to following description and back to FIG. 1 and FIG. 2, the stuck lock represents that the delay amount of the delayed phase Fde is smaller than 0.5 cycles in comparison with the reference phase Fref. In the first shift register set 120, the signals CK1~CK(N+1) outputted from the delay units 112 sample a high-level duration of the first divided phase Fref_2, and in the second shift register set 122, the rising edge of the second divided phase Fref_2B samples the comparison signals $QC_1 \sim QC_{N+1}$ outputted from the first shift register set 120. If stuck lock, the delay amount is small. As a result, the comparison signals L1~L(M+1) outputted from the second shift register set 122 are high. In short, if stuck lock happens, the cycle of the reference phase Fref is T, and a delay time of each delay unit 112 is Td, relation formulas can be expressed as follows:

If stuck lock (or Sr=0, Su=1, and So=0), (N×Td)<0.5T, N>1

$$QC_1(t)=Td \qquad \text{(Eq. 1)}$$

$$QC_N(t)=N \times Td \qquad \text{(Eq. 2)}$$

$$QC_{N+1}(t)=(N+1) \times Td \qquad \text{(Eq. 3)}$$

Substitute (N×Td)<0.5T into Eq. 1, 2, and 3.

$\Rightarrow QC_1(t)=(0.5/N)\times T$ $QC_N(t)=0.5T$ (Eq. 4)

$QC_{N+1}(t)=(0.5/N)\times T+0.5T$ (Eq. 5)

Because the frequency of the first divided phase Fref_2 is half the frequency of the reference phase Fref, durations of the first divided phase Fref_2 corresponding to odd cycles of the reference phase Fref are high, while durations of the first divided phase Fref_2 corresponding to even cycles of the reference phase Fref are low. Then, $QC_1(t)\sim QC_{N+1}(t)=1$, for $t=T, 3T, 5T, \ldots$ $QC_1(t)\sim QC_{N+1}(t)=0$, for $t=2T, 4T, 6T, \ldots$ Therefore, when stuck lock happens (or Sr=0, Su=1, and So=0), L1~L(M+1) are high.

Figure 7:
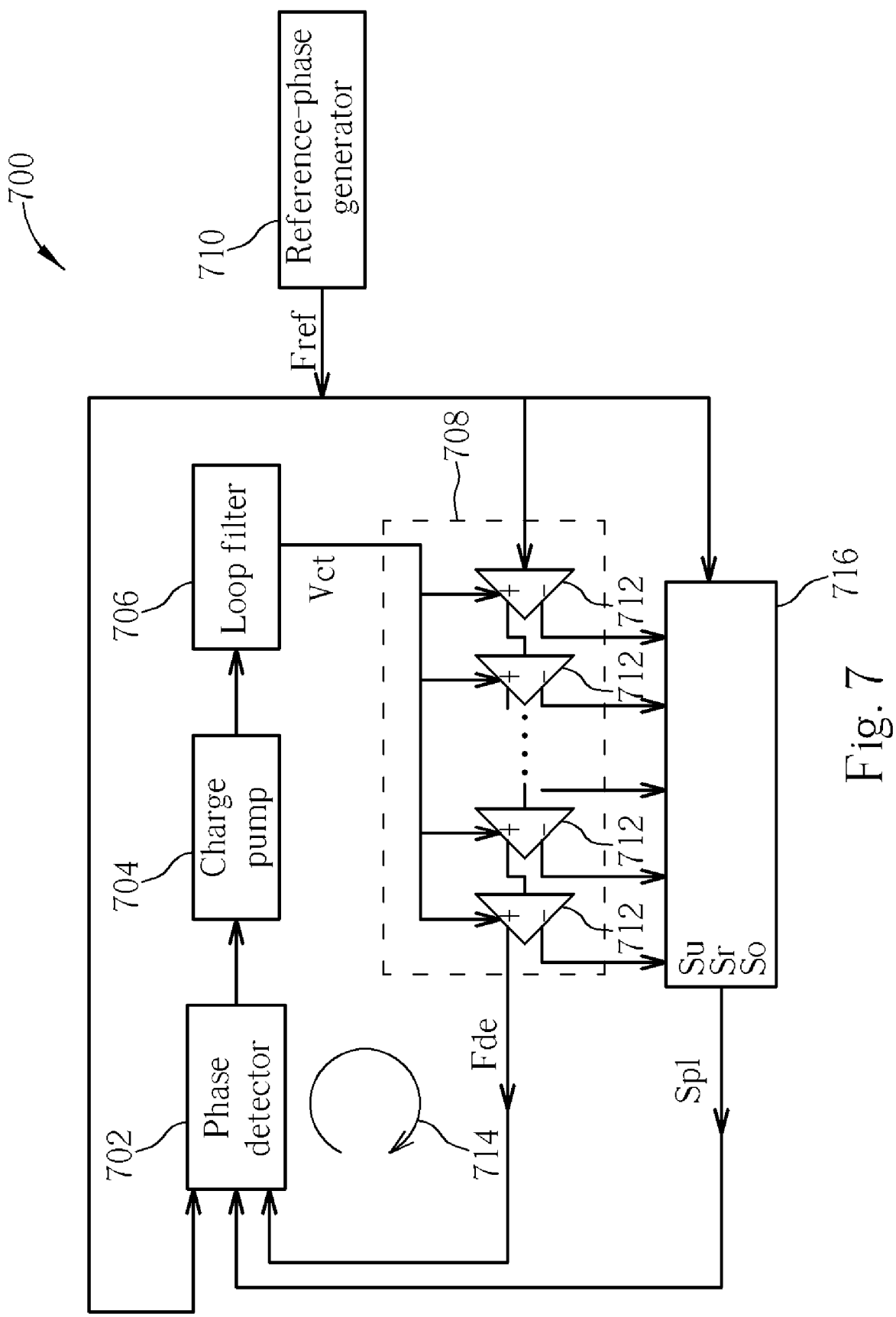
FIG. 7 illustrates a schematic diagram of a lock loop device in accordance with the present invention.
Figure 8:
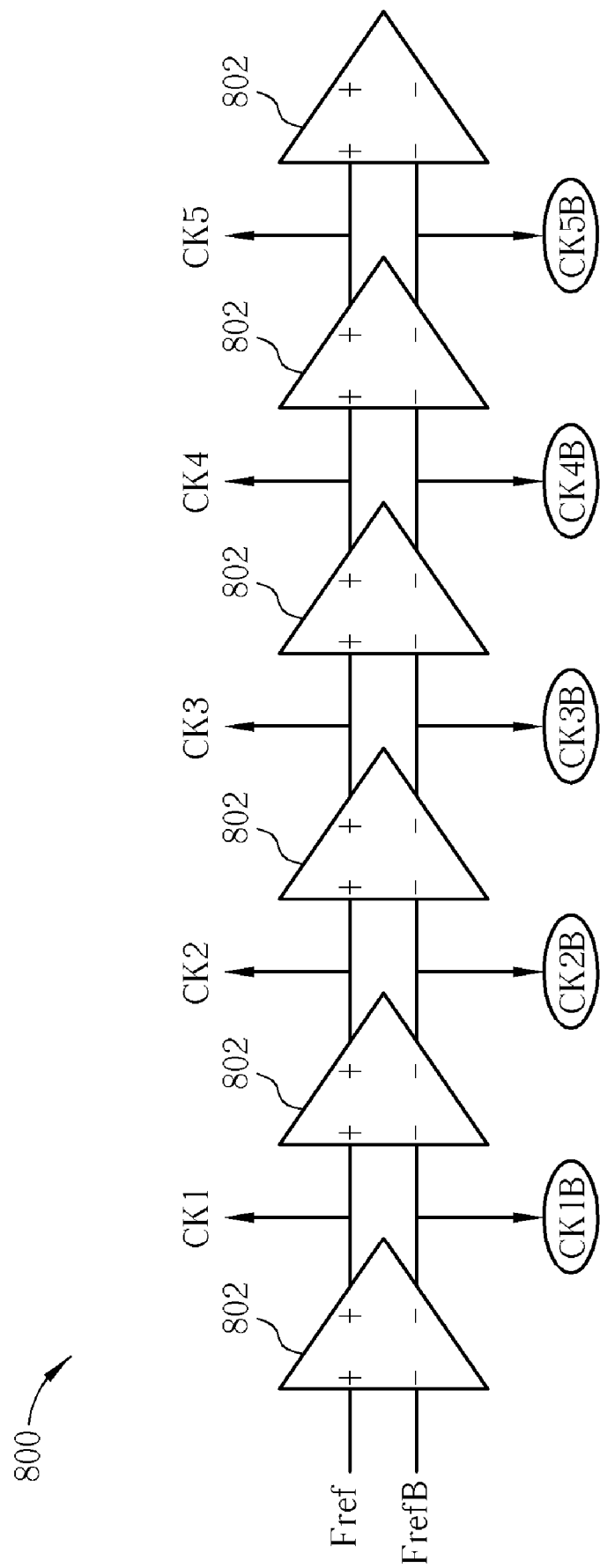
FIG. 8 illustrates a schematic diagram of a voltage control delay circuit having five delay units.
Figure 9:
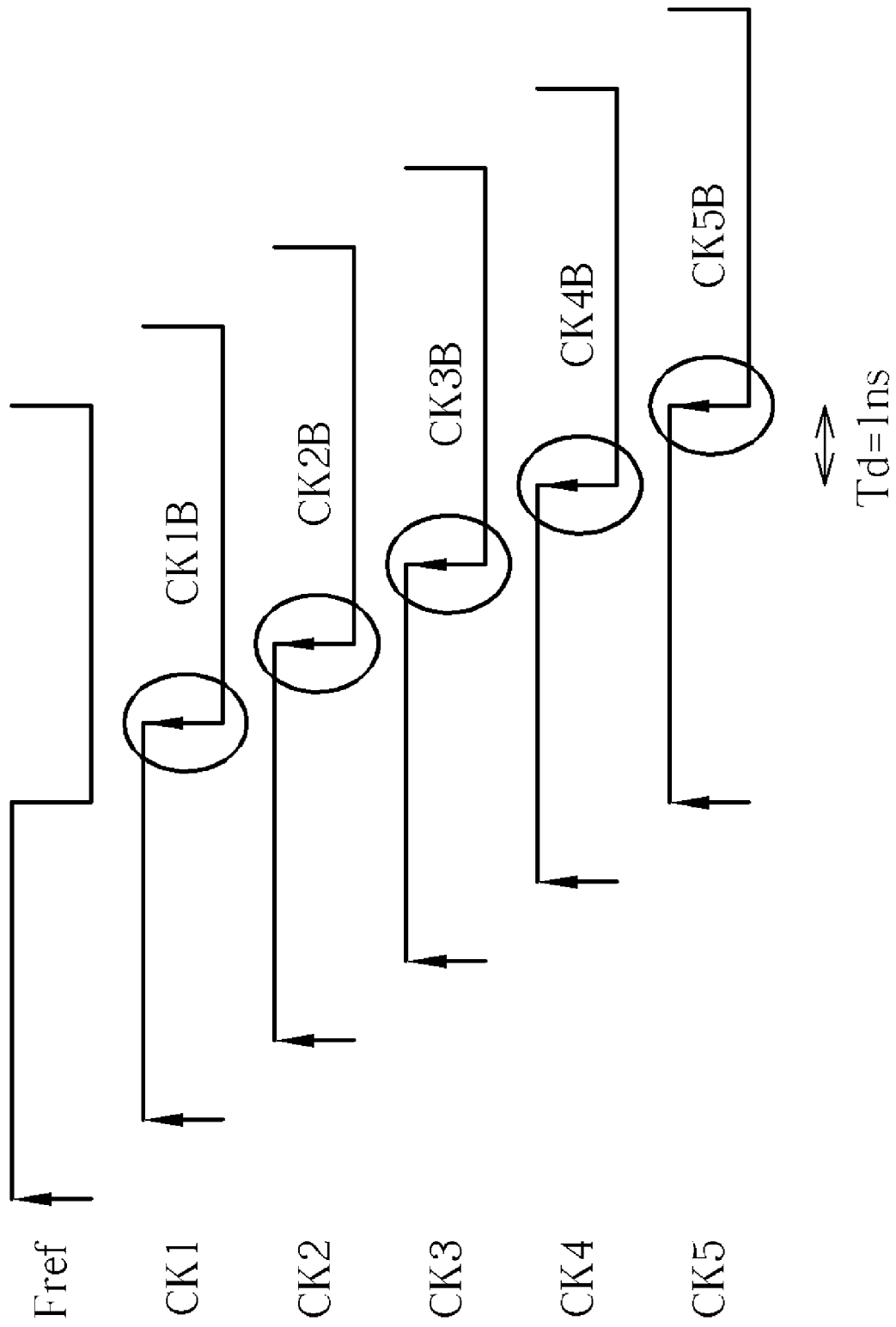
FIG. 9 illustrates a schematic diagram of signals outputted from the voltage control delay circuit shown in FIG. 8 when reaching a correct lock.
Figure 10:
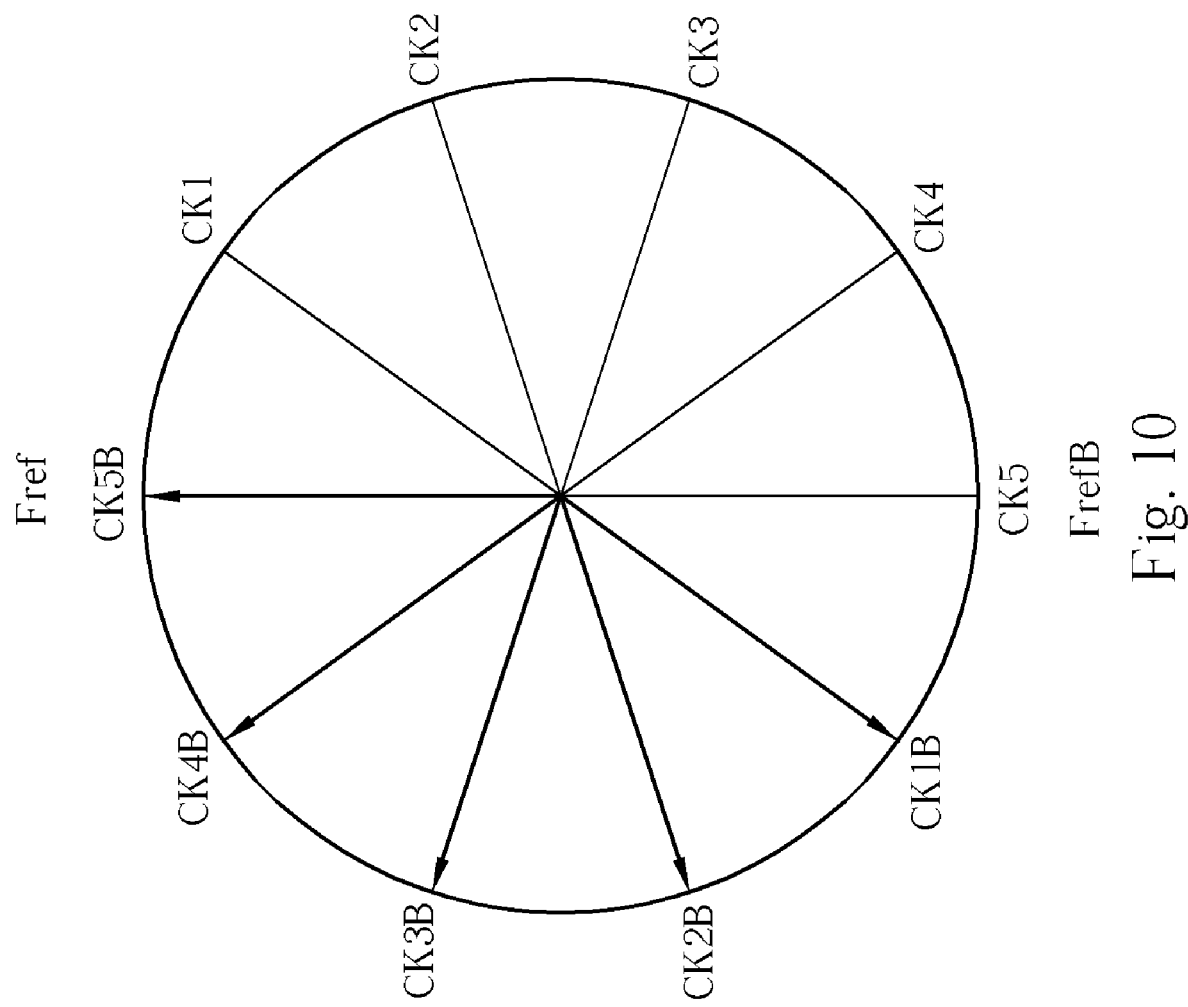
FIG. 10 illustrates a schematic diagram of phases corresponding to the signals in FIG. 9.

Furthermore, the last item 0.5T in Eq. 5 can be a shift, so that the last half phases in even stages can be drawn out to save required shift registers. That is, the present invention determines a lock status according to inverse signals outputted from delay units of last stages in the voltage control delay circuit, so as to decrease shift registers in the first shift register set and the second shift register set. For example, please refer to FIG. 7, which illustrates a schematic diagram of a lock loop device 700 in accordance with the present invention. The lock loop device 700 includes a phase detector 702, a charge pump 704, a loop filter 706, a voltage control delay circuit 708, a reference-phase generator 710, and a lock detector 716. The voltage control delay circuit 708 includes a plurality of delay units 712. Signals outputted from each of the delay units 712 are reversed and transmitted to the lock detector 716, and the lock detector 716 outputs a lock indication signal SpI, so as to form a lock loop 714. The lock indication signal SpI includes an under signal Su, a right signal Sr, and an over signal So. The voltage control delay circuit 708 can increase or decrease the delay units 712 to meet the system requirements. Take a voltage control delay circuit having five-stage delay units for example. Please refer to FIG. 8, FIG. 9, and FIG. 10. FIG. 8 illustrates a schematic diagram of a voltage control delay circuit 800 having five delay units 802, FIG. 9 illustrates a schematic diagram of signals outputted from the voltage control delay circuit 800 when reaching a correct lock, and FIG. 10 illustrates a schematic diagram of phases corresponding to the signals in FIG. 9. As shown in FIG. 9 and FIG. 10, the present invention can prevent a false lock from occurring when a phase difference between the output and input phases of the voltage control delay circuit 800 is 180°, and decrease shift registers in the lock detector 716.

Figure 11:
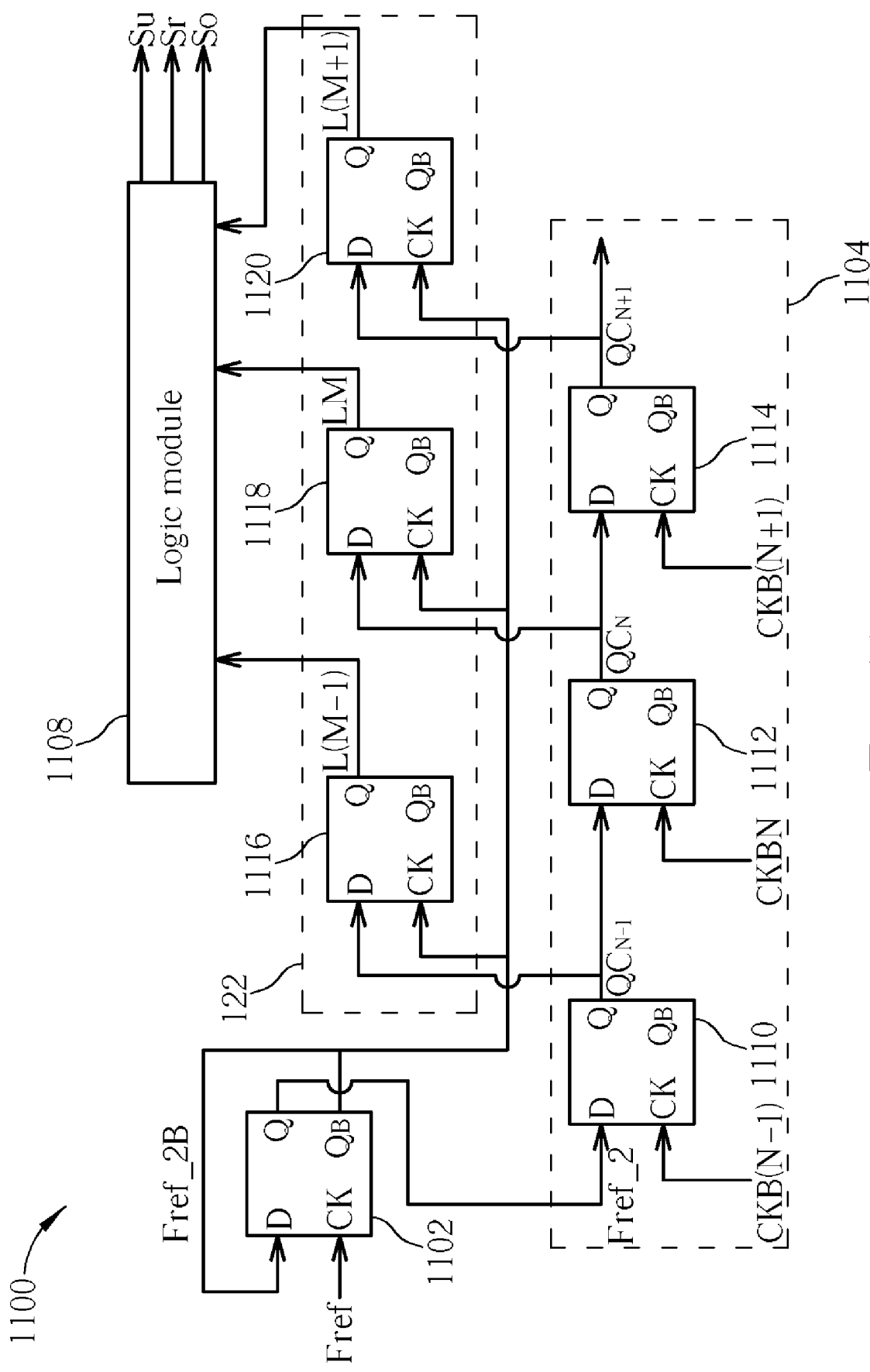
FIG. 11 illustrates a lock detector in accordance with a preferred embodiment of the present invention.

Please refer to FIG. 11, which illustrates a lock detector 1100 in accordance with a preferred embodiment of the present invention. The lock detector 1100 includes a frequency divider 1102, a first shift register set 1104, a second shift register set 1106, and a logic module 1108. The first shift register set 1102 includes D flip-flops 1110, 1112, and 1114 corresponding to last three delay units of a voltage control delay circuit. The second shift register set 1106 includes D flip-flops 1116, 1118, and 1120 corresponding to the D flip-flops 1110, 1112, and 1114 of the first shift register set 1102. The frequency divider 1102 outputs a first divided phase Fref_2 and a second divided phase Fref_2B according to rising edges of a reference phase Fref, so as to prevent the problem of duty-cycle asymmetry. Frequencies of the first and second divided phases Fref_2 and Fref_2B are half the frequency of the reference phase Fref, and the second divided phase Fref_2B is the inverse of the first divided phase Fref_2. Notice that in FIG. 11, the first shift register set 1104 only uses three D flip-flops to generate comparison signals $QC_{N-1}, QC_N$, and $QC_{N+1}$ for the second shift register set 1108 according to the first divided phase Fref_2 and inverse phases CKB(N-1), CKBN, and CKB(N+1) provided by the last three delay units of the voltage control delay circuit, then the second shift register set 1108 generates comparison signals L(M-1), LM, and L(M+1) for the logic module 124 to generate the lock indication signal SpI.

Comparing to the prior art, the present invention can decrease shift registers and prevent a false lock when a phase difference between output and input phases of the voltage control delay circuit is 180°, so as to decrease production costs and increase efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for simplifying a delay-locked loop device comprising following steps:
   (a) reversing phases outputted from delay units of a voltage control delay circuit in the delay-locked loop device;
   (b) transmitting the reversed phases in step (a) to shift registers in a first shift register set corresponding to the delay units of the voltage control delay circuit to generate a first sequence of comparison signals according to a first divided phase and inverse phases of phases outputted from the delay units of the voltage control delay circuit;
   (c) removing a plurality of shift registers in the first shift register set corresponding to a plurality of delay units of initial stages of the voltage control delay circuit according to a default requirement; and
   (d) removing shift registers in a second shift register set corresponding to the removed shift registers in the first shift register set to generate a second sequence of comparison signals according to a second divided phase and the first sequence of the comparison signals.

2. A method for performing a delay lock, comprising following steps:
   generating a delayed phase with a voltage control delay circuit according to a reference phase and a control voltage;
   generating a control signal according to a lock indication signal, the reference phase, and the delayed phase using a phase detector;
   transmitting the control voltage to the voltage control delay circuit according to the control signal using a charge pump;
   generating the lock indication signal for the phase detector according to output phases of at least one delay unit of the voltage control delay circuit using a lock detector;
   generating a first sequence of comparison signals according to a first divided phase and the output phases of at least one delay unit of the voltage control delay circuit using a first shift register set;
   generating a second sequence of comparison signals according to a second divided phase and the first sequence of the comparison signals with a second shift register set; and generating the lock indication signal according to the second sequence of the comparison signals with a logic module.

3. A delay-locked loop device capable of anti-false-locking, comprising:
   a voltage control delay circuit comprising a plurality of delay units in a series for generating a delayed phase according to a reference phase and a control voltage;
   a phase detector coupled to the voltage control delay circuit for generating a control signal according to a lock indication signal, the reference phase, and the delayed phase;
   a charge pump coupled to the phase detector for transmitting the control voltage to the voltage control delay circuit according to the control signal; and
   a lock detector coupled to the voltage control delay circuit for generating the lock indication signal for the phase detector according to output phases of at least one delay unit of the voltage control delay circuit, comprising:
      a first shift register set comprising a number, smaller than the number of the delay units in the voltage control delay circuit, of shift registers each corresponding to a delay unit of the voltage control delay circuit for generating a first sequence of comparison signals according to a first divided phase and the output phases of each delay unit of the voltage control delay circuit;
      a second shift register set comprising a plurality of shift registers each corresponding to a shift register of the first shift register set for generating a second sequence of comparison signals according to a second divided phase and the first sequence of the comparison signals; and
      a logic module coupled to the second shift register set for generating the lock indication signal according to the second sequence of the comparison signals.

4. The delay-locked loop device of claim 3, wherein the lock detector further comprises a frequency divider for generating the first divided phase and the second divided phase with frequencies being half a frequency of the reference phase according to the reference phase.

5. The delay-locked loop device of claim 4, wherein the second divided phase is inverse of the first divided phase.

6. The delay-locked loop device of claim 4, further comprising a loop filter coupled to the charge pump for transforming charges provided by the charge pump into the control voltage for the voltage control delay circuit.

7. The delay-locked loop device of claim 3, further comprising a reference-phase generator for generating the reference phase.

8. The delay-locked loop device of claim 3, wherein the voltage control delay circuit delays the reference phase according to a predetermined delayed phase.

9. The delay-locked loop device of claim 3, wherein the plurality of the shift registers of the first shift register set and the second shift register set are D flip-flops.

* * * * *